US009613910B2

(12) United States Patent
Su et al.

(10) Patent No.: US 9,613,910 B2

(45) Date of Patent: Apr. 4, 2017

(54) ANTI-FUSE ON AND/OR IN PACKAGE

(71) Applicant: Taiwan Semiconductor Manufacturing Company, Ltd., Hsin-Chu (TW)

(72) Inventors: An-Jhih Su, Bade (TW); Hsien-Wei Chen, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 6 days.

(21) Appl. No.: 14/334,217

(22) Filed: Jul. 17, 2014

(65) Prior Publication Data

US 2016/0020172 A1 Jan. 21, 2016

(51) Int. Cl.

*H01L 29/00* (2006.01)
*H01L 23/525* (2006.01)

(Continued)

(52) U.S. Cl.

CPC ...... *H01L 23/5382* (2013.01); *H01L 21/6835* (2013.01); *H01L 23/49822* (2013.01); *H01L 23/5389* (2013.01); *H01L 24/19* (2013.01); *H01L 24/97* (2013.01); *H01L 23/49816* (2013.01); *H01L 24/45* (2013.01); *H01L 24/73* (2013.01); *H01L 24/83* (2013.01); *H01L 24/92* (2013.01); *H01L 2221/68318* (2013.01); *H01L 2221/68372* (2013.01); *H01L 2221/68381* (2013.01); *H01L 2224/04105* (2013.01); *H01L 2224/12105* (2013.01); *H01L 2224/2919* (2013.01); *H01L 2224/32225* (2013.01); *H01L 2224/45111* (2013.01); *H01L 2224/45124* (2013.01); *H01L 2224/45139* (2013.01); *H01L 2224/45144* (2013.01); *H01L 2224/45147* (2013.01); *H01L 2224/45164* (2013.01); *H01L 2224/45169* (2013.01); *H01L 2224/73267* (2013.01); *H01L 2224/83005* (2013.01);

(Continued)

(58) Field of Classification Search

CPC ............. H01L 23/5252; H01L 21/6835; H01L 23/5389; H01L 24/18; H01L 24/73; H01L 23/3135

USPC .......................... 438/433; 257/529, 738, 690

See application file for complete search history.

(56) References Cited

U.S. PATENT DOCUMENTS 8,361,842 B2 1/2013 Yu et al.
8,680,647 B2 3/2014 Yu et al.

(Continued)

FOREIGN PATENT DOCUMENTS

KR 20070100355 A 10/2007
WO 2006043388 A1 4/2006

*Primary Examiner* — Kimberly Rizkallah
*Assistant Examiner* — Brian Turner
(74) *Attorney, Agent, or Firm* — Slater Matsil, LLP

(57) ABSTRACT

A package structure includes an integrated circuit die, a redistribution structure, an anti-fuse, and external connectors. The integrated circuit die is embedded in an encapsulant. The redistribution structure is on the encapsulant and is electrically coupled to the integrated circuit die. The anti-fuse is external to the integrated circuit die and the redistribution structure. The anti-fuse is mechanically and electrically coupled to the redistribution structure. The external connectors are on the redistribution structure, and the redistribution structure is disposed between the external connectors and the encapsulant.

20 Claims, 19 Drawing Sheets

(51) Int. Cl.

| | |
|---|---|
| ***H01L 23/498*** | (2006.01) |
| ***H01L 23/538*** | (2006.01) |
| ***H01L 21/56*** | (2006.01) |
| ***H01L 23/13*** | (2006.01) |
| ***H01L 23/00*** | (2006.01) |
| ***H01L 21/683*** | (2006.01) |

(52) U.S. Cl.
CPC ............... *H01L 2224/83191* (2013.01); *H01L 2224/92244* (2013.01); *H01L 2224/94* (2013.01); *H01L 2224/97* (2013.01); *H01L 2924/15311* (2013.01); *H01L 2924/19043* (2013.01); *H01L 2924/19105* (2013.01); *H01L 2924/19107* (2013.01)

(56) References Cited

U.S. PATENT DOCUMENTS

| | | | | |
|---|---|---|---|---|
| 8,703,542 | B2 | 4/2014 | Lin et al. | |
| 8,759,964 | B2 | 6/2014 | Pu et al. | |
| 8,778,738 | B1 | 7/2014 | Lin et al. | |
| 8,785,299 | B2 | 7/2014 | Mao et al. | |
| 8,791,501 | B1* | 7/2014 | Fuentes | 257/154 |
| 8,803,306 | B1 | 8/2014 | Yu et al. | |
| 8,809,996 | B2 | 8/2014 | Chen et al. | |
| 8,829,676 | B2 | 9/2014 | Yu et al. | |
| 8,877,554 | B2 | 11/2014 | Tsai et al. | |
| 2004/0217441 | A1* | 11/2004 | Lehmann | H01L 23/5252 257/530 |
| 2007/0262470 | A1 | 11/2007 | Ichiryu et al. | |
| 2008/0316714 | A1* | 12/2008 | Eichelberger | H01L 21/6835 361/728 |
| 2009/0224391 | A1* | 9/2009 | Lin | H01L 21/6835 257/690 |
| 2010/0059854 | A1* | 3/2010 | Lin | H01L 25/16 257/528 |
| 2010/0140736 | A1 | 6/2010 | Lin et al. | |
| 2010/0289126 | A1* | 11/2010 | Pagaila | H01L 23/49822 257/659 |
| 2010/0308443 | A1 | 12/2010 | Suthiwongsunthorn et al. | |
| 2010/0320569 | A1* | 12/2010 | Narita | B82Y 10/00 257/537 |
| 2011/0006412 | A1 | 1/2011 | Choi | |
| 2011/0291288 | A1 | 12/2011 | Wu et al. | |
| 2012/0061858 | A1 | 3/2012 | Park et al. | |
| 2013/0026468 | A1 | 1/2013 | Yoshimuta et al. | |
| 2013/0062760 | A1 | 3/2013 | Hung et al. | |
| 2013/0062761 | A1 | 3/2013 | Lin et al. | |
| 2013/0168848 | A1 | 7/2013 | Lin et al. | |
| 2013/0298101 | A1* | 11/2013 | Chandra | G06F 17/50 716/136 |
| 2013/0307140 | A1 | 11/2013 | Huang et al. | |
| 2014/0077364 | A1* | 3/2014 | Marimuthu | H01L 23/5389 257/737 |
| 2014/0084416 | A1* | 3/2014 | Kang | H01L 23/50 257/532 |
| 2014/0203429 | A1 | 7/2014 | Yu et al. | |
| 2014/0211441 | A1 | 7/2014 | Tsukizawa | |
| 2014/0225222 | A1 | 8/2014 | Yu et al. | |
| 2014/0252646 | A1 | 9/2014 | Hung et al. | |
| 2014/0264930 | A1 | 9/2014 | Yu et al. | |
| 2014/0291819 | A1 | 10/2014 | Barth | |
| 2014/0313681 | A1 | 10/2014 | Yamano et al. | |
| 2015/0062998 | A1* | 3/2015 | Nam | G11C 17/16 365/96 |

* cited by examiner

ANTI-FUSE ON AND/OR IN PACKAGE

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components such as integrated circuit dies may also require smaller packages that utilize less area than packages of the past, in some applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
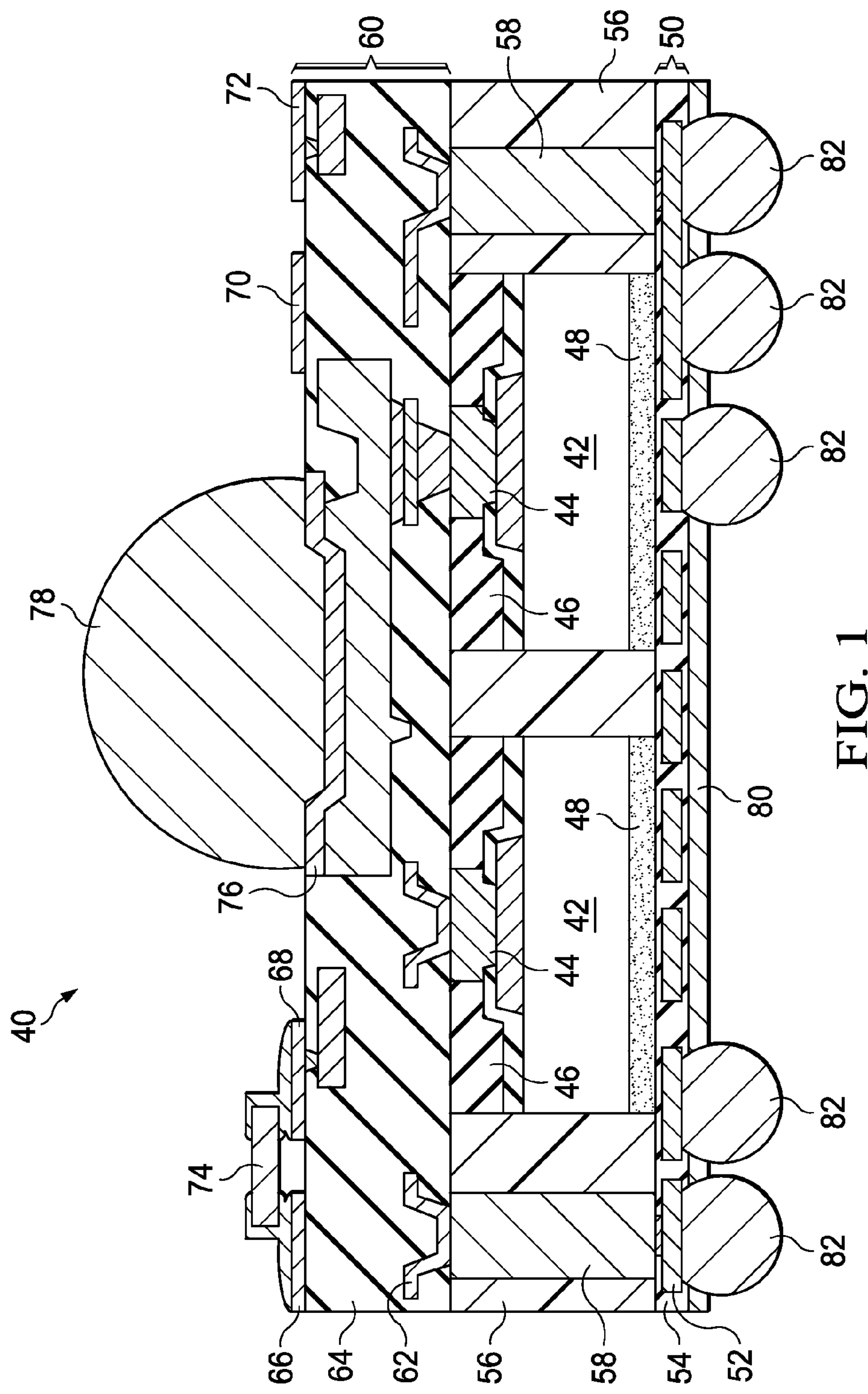
FIG. 1 is a cross sectional view of a package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. Similarly, terms such as "front side" and "back side" may be used herein to more easily identify various components, and may identify that those components are, for example, on opposing sides of another component. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely anti-fuses used in a fan-out or fan-in wafer-level package. Other embodiments contemplate other applications, such as different package types or different configurations that would be readily apparent to a person of ordinary skill in the art upon reading this disclosure. It should be noted that embodiments discussed herein may not necessarily illustrate every component or feature that may be present in a structure. For example, multiples of a component may be omitted from a figure, such as when discussion of one of the component may be sufficient to convey aspects of the embodiment. Further, method embodiments discussed herein may be discussed as being performed in a particular order; however, other method embodiments may be performed in any logical order.

FIG. 1 illustrates a cross sectional view of a package 40, such as a fan-out or fan-in wafer-level package, that comprises one or more integrated circuit dies 42 that is programmed by one or more surface mount device (SMD) 74 disposed on or in the package 40 in accordance with some embodiments. The integrated circuit dies 42 each comprise a semiconductor substrate, such as silicon, doped or undoped, or an active layer of a semiconductor-on-insulator (SOI) substrate. The semiconductor substrate may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate and may be interconnected by interconnect structures formed by, for example, metallization patterns in one or more dielectric layers on the semiconductor substrate to form an integrated circuit.

Die connectors 44, such as conductive pillars (for example, comprising a metal such as copper), are exterior to the integrated circuit dies 42 and are mechanically and electrically coupled to the respective integrated circuit dies 42 on what may be referred to as respective active sides of the integrated circuit dies 42. The die connectors 44 electrically couple the respective integrated circuits of the integrate circuit dies 42.

A dielectric material 46 is on the active sides of the integrated circuit dies 42. The dielectric material 46 laterally encapsulates the die connectors 44, which have upper surfaces that are co-planar with upper surfaces of the dielectric material 46, and the dielectric material 46 is laterally coterminus with the respective integrated circuit dies 42. The dielectric material 46 may be a polymer such as polybenzoxazole (PBO), polyimide, benzocyclobutene (BCB), or the like; a nitride such as silicon nitride or the like; an oxide such as silicon oxide, PhosphoSilicate Glass (PSG), BoroSilicate Glass (BSG), Boron-doped PhosphoSilicate Glass (BPSG), or the like; the like, or a combination thereof.

Adhesive 48 is on back sides of the integrated circuit dies 42 and adheres the integrated circuit dies to a front side redistribution structure 50. The adhesive 48 may be any suitable adhesive, epoxy, or the like.

The front side redistribution structure 50 comprises one or more metallization pattern 52 in one or more dielectric layer 54. The one or metallization pattern 52 can comprise any of lines, vias, pads, the like, or a combination thereof, and may comprise a conductive material, such as a metal, like copper, titanium, tungsten, aluminum, or the like. The one or more dielectric layer 54 may be a polymer such as PBO, polyimide, BCB, or the like; a nitride such as silicon nitride or the like; an oxide such as silicon oxide, PSG, BSG, BPSG, or the like; the like; or a combination thereof.

An encapsulant 56 at least laterally encapsulates the integrated circuit dies 42. The encapsulant 56 has a first surface that adjoins the redistribution structure 50 and has a second surface that is co-planar with upper surfaces of the dielectric material 46 and the die connectors 44. The encapsulant 56 may be a molding compound, epoxy, or the like.

Through vias 58 extend through the encapsulant 56, for example, from the first surface of the encapsulant 56 to the second surface of the encapsulant 56. The through vias 58 electrically couple the front side redistribution structure 50, for example, at least a portion of the one or more metallization patterns 52, with a back side redistribution structure 60, for example, at least a portion of one or more metallization patterns 62. The through vias 58 may comprise a conductive material, such as a metal, like copper, titanium, tungsten, aluminum, or the like.

The back side redistribution structure 60 comprises one or more metallization pattern 62 in one or more dielectric layer 64. At least a portion of the one or more metallization pattern 62 is electrically coupled to the respective integrated circuits on the integrated circuit dies 42 through the respective die connectors 44. The one or metallization pattern 62 can comprise any of lines, vias, pads, the like, or a combination thereof, and may comprise a conductive material, such as a metal, like copper, titanium, tungsten, aluminum, or the like. The one or more dielectric layer 64 may be a polymer such as PBO, polyimide, BCB, or the like; a nitride such as silicon nitride or the like; an oxide such as silicon oxide, PSG, BSG, BPSG, or the like; the like; or a combination thereof.

The one or more metallization pattern 62 comprises pads 66, 68, 70, and 72 exposed on the back side redistribution structure 60. The pads 66, 68, 70, and 72 may be locations for forming an anti-fuse. For example, a SMD 74, such as a resistor or any acceptable jumper, is bonded to the pads 66 and 68 to form an electrical connection between pads 66 and 68. In this example, no SMD is bonded between pads 70 and 72 such that no closed-loop circuit is formed between the pads 70 and 72. Thus, the SMD 74 may be an anti-fuse to create a closed-loop circuit to electrically couple, for example, portions of integrated circuits on integrated circuit dies 42 and/or various metallization patterns 52 and/or 62 in the redistribution structures 50 and 60. In some embodiments, the SMD 74 is a low resistance resistor, such as having a resistance less than about 0.1 ohms, and more specifically, less than about 0.05 ohms. In other embodiments, such as discussed below, other components, such as a wire bond or other acceptable jumper, may be used as an anti-fuse.

The one or more metallization pattern 62 further comprises an under-metal 76 exposed on the back side redistribution structure 60. An external connector 78, such as a solder ball like a ball grid array (BGA) ball, is on the under-metal 76. In some embodiments, the external connector 78 comprises solder, such as a Sn—Ag alloy, a Sn—Ag—Cu alloy, or the like, and may be lead-free or lead-containing.

Pads of the one or more metallization pattern 52 of the front side redistribution structure 50 are also exposed. External connectors 82, such as solder bumps, metal pillars, the like, or a combination such as metal pillars with solder thereon, are on the pads of the one or more metallization pattern 52. In some embodiments, the external connectors 82 comprise solder, such as a Sn—Ag alloy, a Sn—Ag—Cu alloy, or the like, and may be lead-free or lead-containing. A solder resist layer 80 is also on the front side redistribution structure 50.

Figure 2:
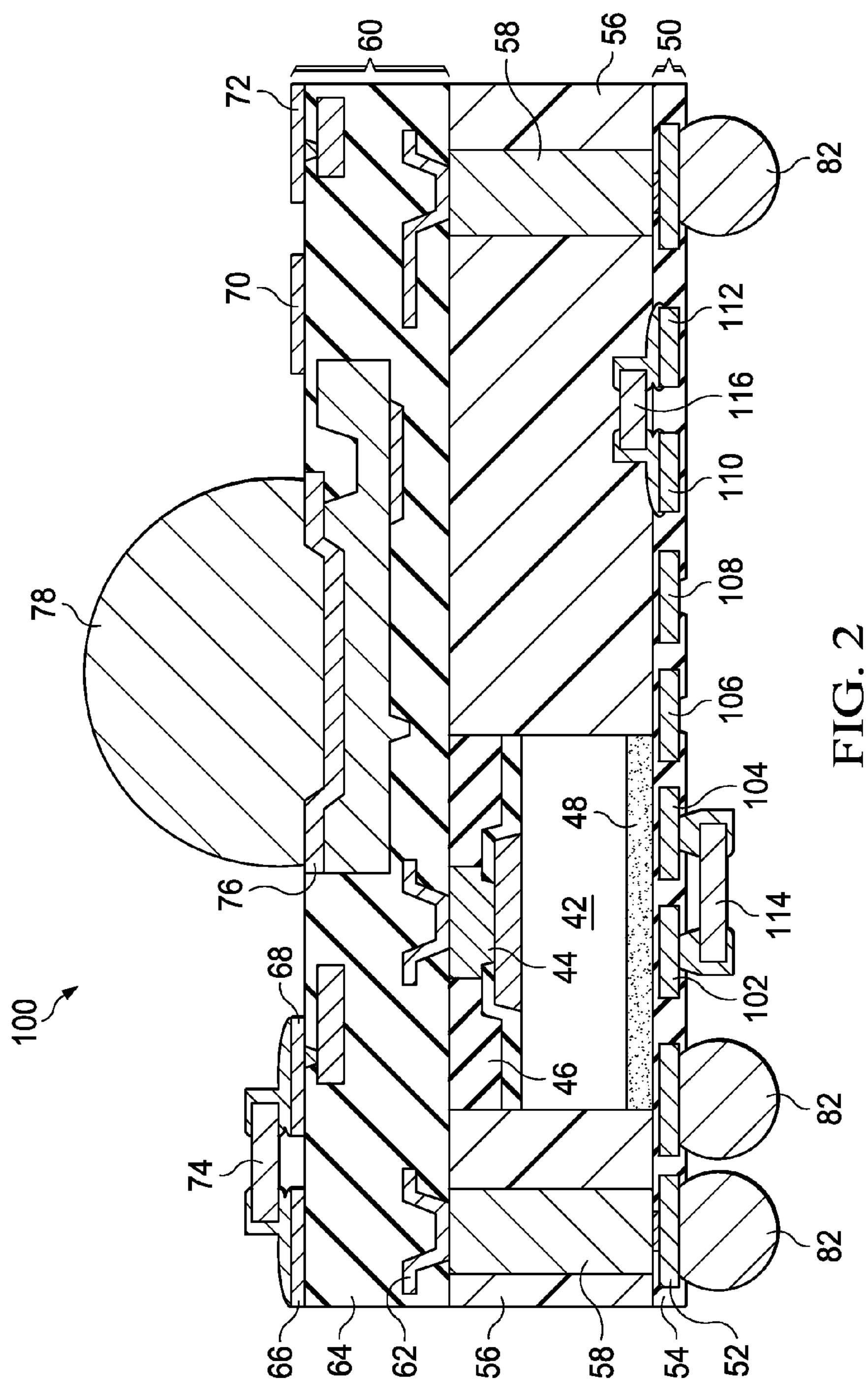
FIG. 2 is a cross sectional view of another package in accordance with some embodiments.

FIG. 2 illustrates a package 100 that comprises one or more integrated circuit dies 42 that is programmed by one or more SMD disposed on or in the package 100 in accordance with some embodiments. The package 100 is generally similar to the package 40 in FIG. 1, and thus, discussion of features that are discussed above with respect to FIG. 1 and illustrated in FIG. 2 is omitted herein.

The one or more metallization pattern 52 comprises pads 102, 104, 106, 108, 110, and 112. The pads 102, 104, 106, 108, 110, and 112 may be locations for forming an anti-fuse. For example, a SMD 114, such as a resistor or any acceptable jumper, is bonded to the pads 102 and 104 to form an electrical connection between pads 102 and 104. The SMD 114 is on an exterior surface of the package 100. Further in this example, a SMD 116, such as a resistor or any acceptable jumper, is bonded to the pads 110 and 112 to form an electrical connection between pads 110 and 112. The SMD 116 is embedded in the encapsulant 56. Hence, the SMD 116 is disposed on an opposite side of the front side redistribution structure 50 from the SMD 114. In this example, no SMD is bonded between pads 106 and 108 such that no closed-loop circuit is formed between the pads 106 and 108. Thus, the SMDs 114 and 116 may be an anti-fuse to create a closed-loop circuit to electrically couple, for example, portions of an integrated circuit on the integrated circuit die 42 and/or various metallization patterns 52 and/or 62 in the redistribution structures 50 and 60. In some embodiments, the SMDs 114 and 116 are low resistance resistors, such as having a resistance less than about 0.1 ohms, and more specifically, less than about 0.05 ohms. In other embodiments, such as discussed below, other components, such as a wire bond or other acceptable jumper, may be used as an anti-fuse. This illustrated embodiment shows multiple locations where an anti-fuse may be placed in the package 100.

Figure 3:
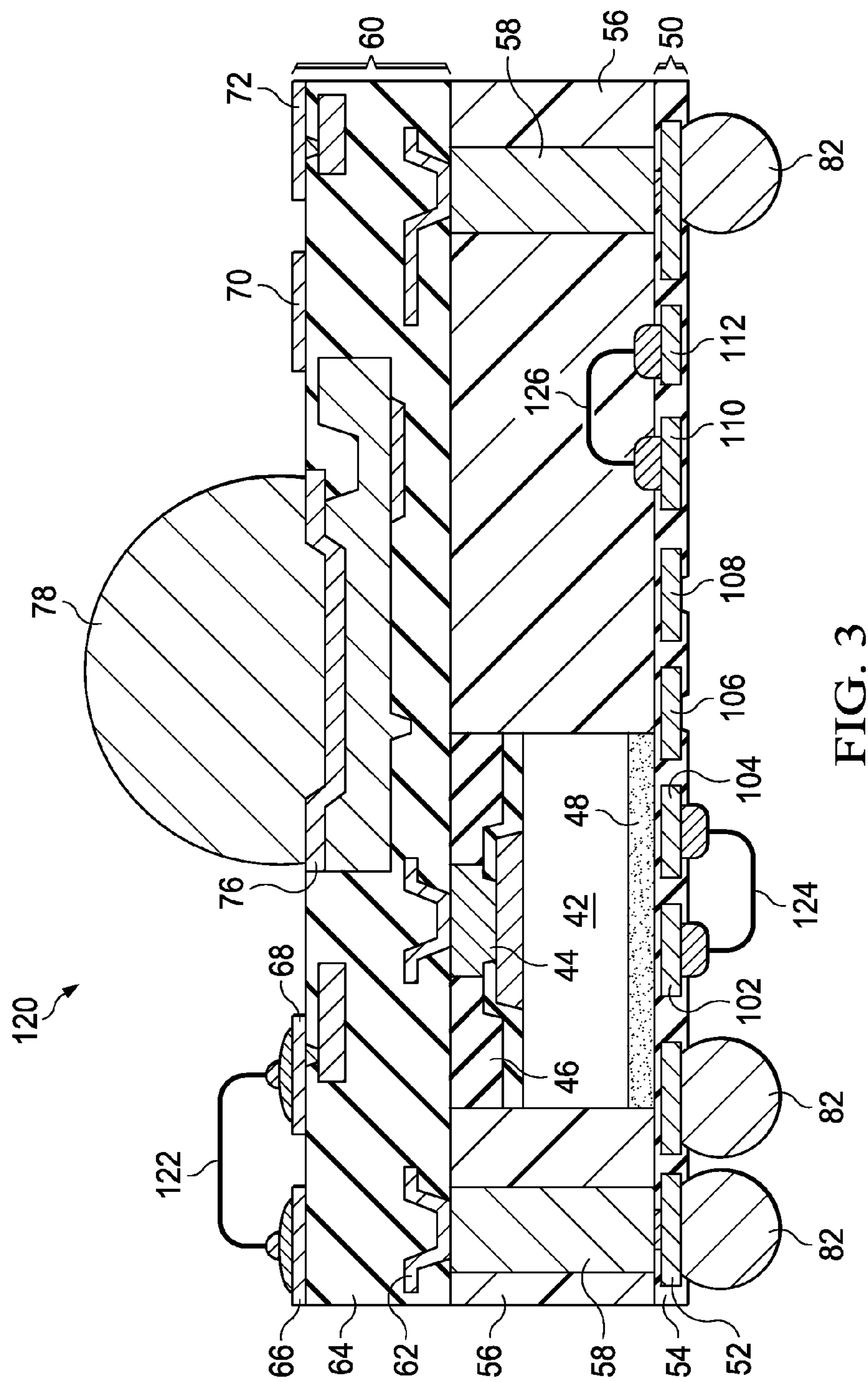
FIG. 3 is a cross sectional view of a further package in accordance with some embodiments.

FIG. 3 illustrates a package 120 that comprises one or more integrated circuit dies 42 that is programmed by one or more wire bond disposed on or in the package 120 in accordance with some embodiments. The package 120 is generally similar to the packages 40 and 100 in FIGS. 1 and 2, respectively, and thus, discussion of features that are discussed above with respect to FIGS. 1 and 2 and illustrated in FIG. 3 is omitted herein.

Wire bonds 122, 124, and 126 are used in the place of SMDs 74, 114, and 116, respectively, as anti-fuses in FIG. 3. The wire bonds 122, 124, and 126 may comprise any acceptable wire, such as copper, gold, aluminum, silver, platinum, palladium, tin, the like, or composites thereof. This illustrated embodiment shows that another jumper, for example, a wire bond, may be used as an anti-fuse in the package 120.

Figure 4B:
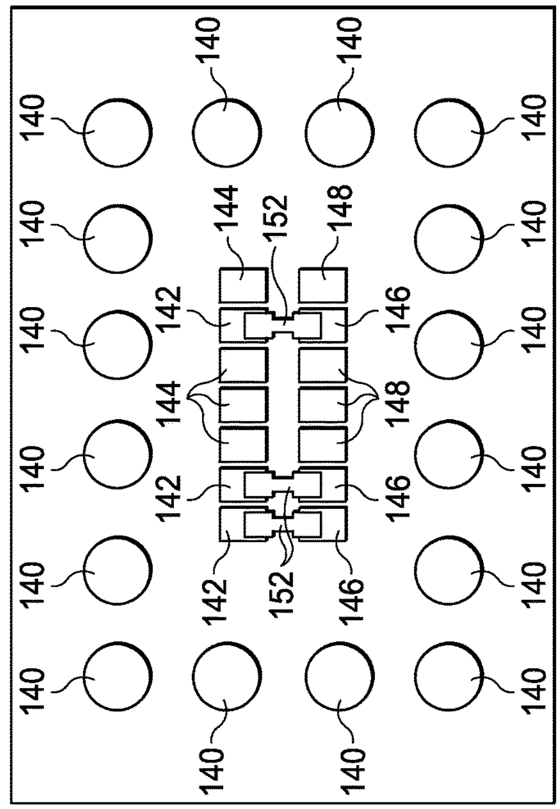
FIGS. 4A and 4B are layout views of exterior surfaces of a redistribution structure in accordance with some embodiments
Figure 4A:
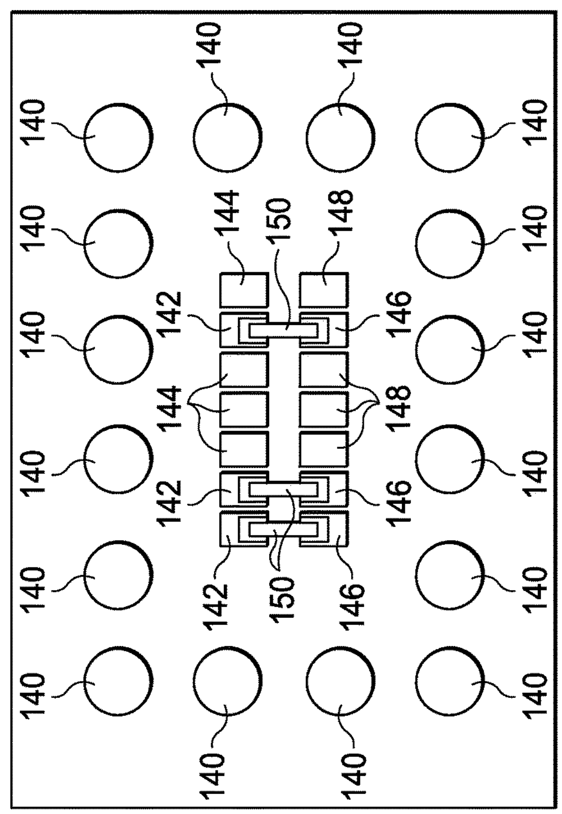

FIGS. 4A and 4B illustrate layout views of exterior surfaces of the back side redistribution structure 60 in accordance with some embodiments. Similar layouts may also be used for exterior surfaces of the front side redistribution structure 50. Aspects of these layouts may be applied at any location where an anti-fuse may be located.

The exterior surfaces comprise pads 140, 142, 144, 146, and 148. The pads 140 may be for electrically and mechanically coupling external electrical connectors, such as connectors 78 and/or 82 discussed above. For example, the pads 140 may be for BGA balls. The pads 140, in these embodiments, encircle an anti-fuse area in which pads 142, 144, 146, and 148 are disposed. Pads 142, 144, 146, and 148 are used to connect or not connect a jumper, such as a SMD 150 or wire bond 152, to program the integrated circuit(s) on an integrated circuit die(s). In FIG. 4A, SMDs 150, such as a resistor, are connected between corresponding pads 142 and 146, while no anti-fuse is connected between corresponding pads 144 and 148. In FIG. 4B, wire bonds 152 are connected between corresponding pads 142 and 146, while no anti-fuse is connected between corresponding pads 144 and 148. By connecting the SMDs 150 or the wire bonds 152 between pads 142 and 146, a closed circuit is formed, while a circuit remains open between pads 144 and 148 because no anti-fuse is connected between pads 144 and 148. Hence, the SMDs 150, wire bonds 152, or other jumpers may be used as an anti-fuse.

The layouts in FIGS. 4A and 4B illustrate that pads for anti-fuses may have any number of pairs of pads for connecting anti-fuses. Further, a package may have any number of areas for pads for anti-fuses on any surface, such as exterior surfaces or embedded, interior surfaces. Additionally, any combination of SMDs, wire bonds, or other jumpers may be used in a package as an anti-fuse.

Figure 5:
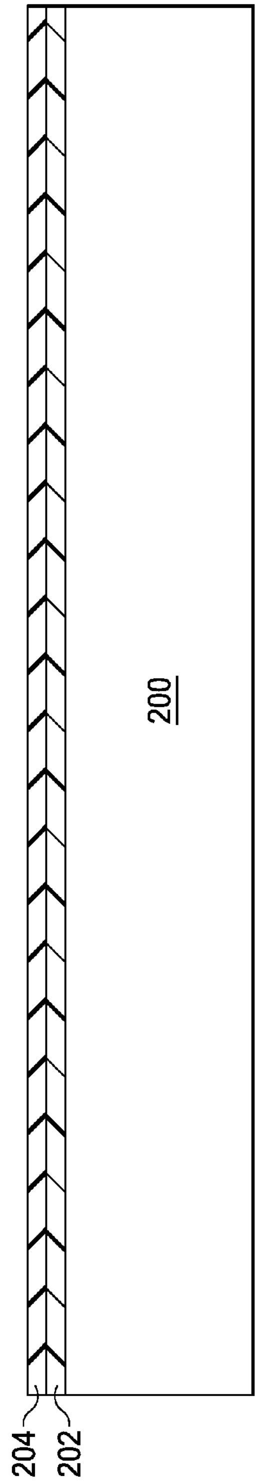
FIGS. 5 through 22 illustrate cross sectional views of intermediate steps during a process for forming a package in accordance with some embodiments.

FIGS. 5 through 22 illustrate cross sectional views of intermediate steps during a process for forming a package in accordance with some embodiments. FIG. 5 illustrates a carrier 200 and a release layer 202 formed on the carrier 200. The carrier 200 may be a glass carrier, a ceramic carrier, or the like. The carrier 200 may be a wafer. The release layer 202 may be formed of a polymer-based material, which may be removed along with the carrier 200 from the overlying structures that will be formed in subsequent steps. In some embodiments, the release layer 202 is an epoxy-based thermal-release material, which loses its adhesive property when heated. In other embodiments, the release layer 202 may be an ultra-violet (UV) glue, which loses its adhesive property when exposed to UV lights. The release layer 202 may be dispensed as a liquid and cured, may be a laminate film laminated onto the carrier 200, or may be the like. The top surface of the release layer 202 may be leveled and may have a high degree of co-planarity.

A dielectric layer 204 is formed on the release layer 202. The bottom surface of the dielectric layer 204 may be in contact with the top surface of the release layer 202. In some embodiments, the dielectric layer 204 is formed of a polymer, such as PBO, polyimide, BCB, or the like. In other embodiments, the dielectric layer 204 is formed of a nitride such as silicon nitride; an oxide such as silicon oxide, PSG, BSG, BPSG, or the like; or the like. The dielectric layer 204 may be formed by any acceptable deposition process, such as spin coating, chemical vapor deposition (CVD), laminating, the like, or a combination thereof.

Figure 6:
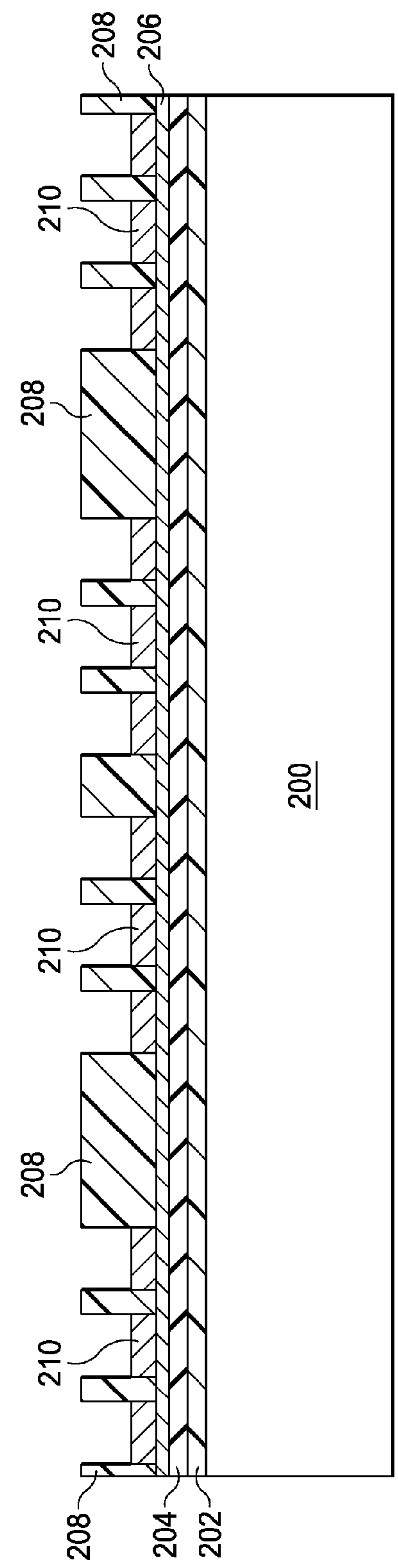

Referring to FIG. 6, a seed layer 206 is formed over the dielectric layer 204. In some embodiments, the seed layer 206 is a metal layer, which may be a single layer or a composite layer comprising a plurality of sub-layers formed of different materials. In some embodiments, the seed layer 206 comprises a titanium layer and a copper layer over the titanium layer. The seed layer 206 may be formed using, for example, Physical Vapor Deposition (PVD) or the like.

A photo resist 208 is formed and patterned on the seed layer 206. The photo resist 208 may be formed by spin coating or the like and may be exposed to light for patterning. The pattern of the photo resist 208 corresponds to a metallization pattern. The patterning forms openings through the photo resist 208 to expose the seed layer 206.

A conductive material 210 is formed in the openings of the photo resist 208 and on the exposed portions of the seed layer 206. The conductive material 210 may be formed by plating, such as electroplating or electroless plating, or the like. The conductive material 210 may comprise a conductive material, such as a metal, like copper, titanium, tungsten, aluminum, or the like.

Figure 7:
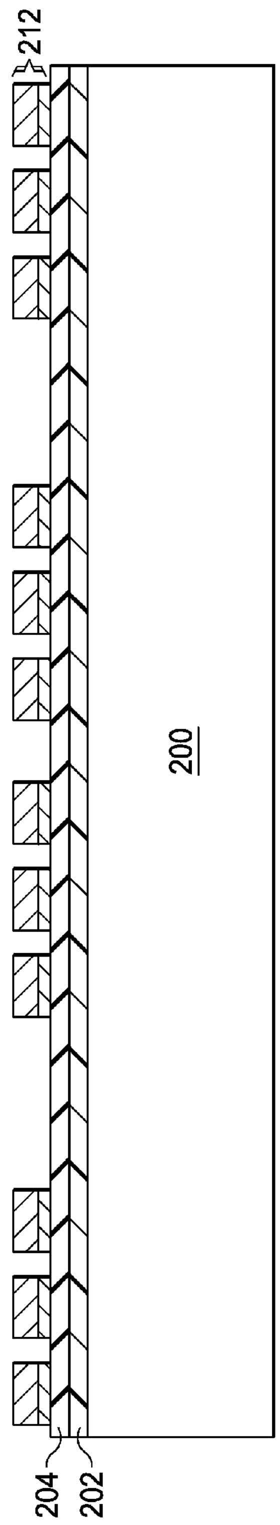

In FIG. 7, the photo resist 208 and portions of the seed layer 206 on which the conductive material 210 is not formed are removed. The photo resist 208 may be removed by an acceptable ashing or stripping process, such as using an oxygen plasma or the like. Once the photo resist 208 is removed, exposed portions of the seed layer 206 are removed, such as by using an acceptable etching process, such as by wet or dry etching. The remaining portions of the seed layer 206 and conductive material 210 form a metallization pattern 212.

Figure 8:
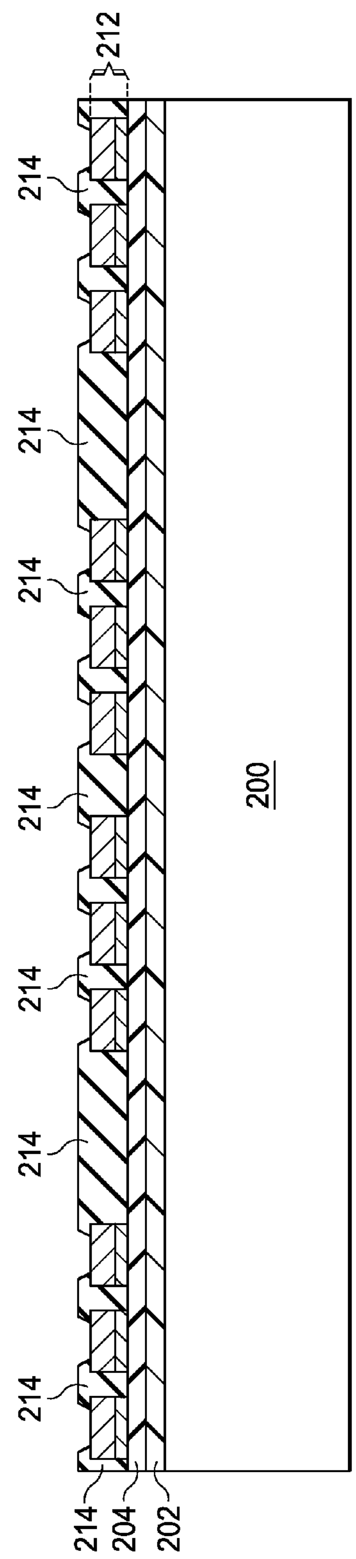

In FIG. 8, a dielectric layer 214 is formed on the metallization pattern 212 and the dielectric layer 204. In some embodiments, the dielectric layer 214 is formed of a polymer, which may be a photo-sensitive material such as PBO, polyimide, BCB, or the like, that may be easily patterned using a lithography mask. In other embodiments, the dielectric layer 214 is formed of a nitride such as silicon nitride; an oxide such as silicon oxide, PSG, BSG, BPSG; or the like. The dielectric layer 214 may be formed by spin coating, lamination, CVD, the like, or a combination thereof. The dielectric layer 214 is then patterned to form openings to expose portions of the metallization pattern 212. The patterning may be by an acceptable process, such as by exposing the dielectric layer 214 to light when the dielectric layer is a photo-sensitive material or by etching using, for example, an anisotropic etch.

Figure 9:
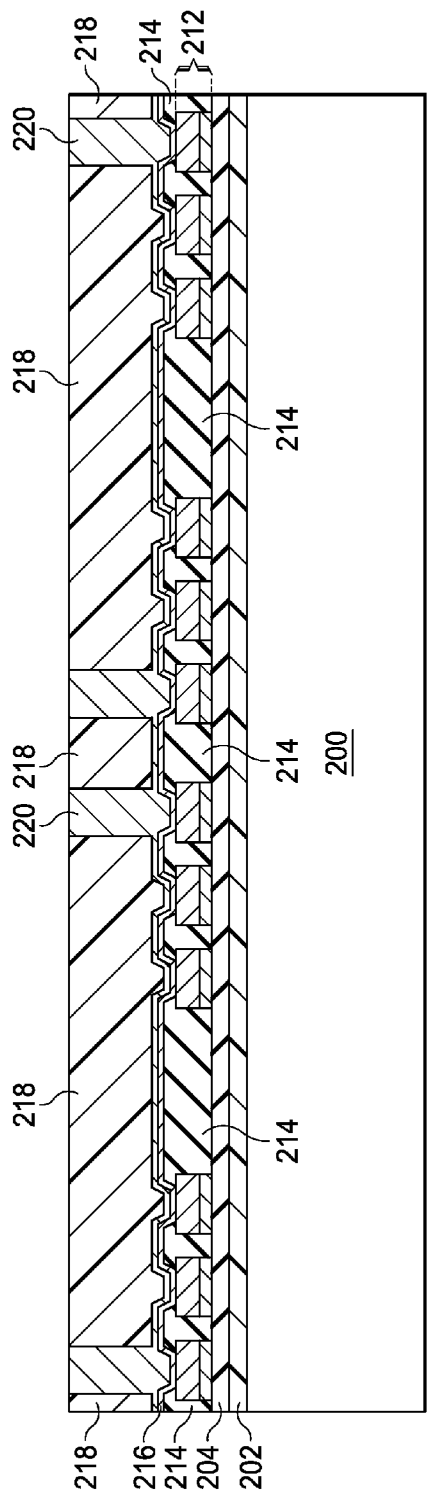

Referring to FIG. 9, a seed layer 216 is formed over the dielectric layer 214 and the exposed portions of the metallization pattern 212. In some embodiments, the seed layer 216 is a metal layer, which may be a single layer or a composite layer comprising a plurality of sub-layers formed of different materials. In some embodiments, the seed layer 216 comprises a titanium layer and a copper layer over the titanium layer. The seed layer 216 may be formed using, for example, PVD or the like.

A photo resist 218 is formed and patterned on the seed layer 216. The photo resist 218 may be formed by spin coating or the like and may be exposed to light for patterning. The pattern of the photo resist 218 corresponds to through vias. The patterning forms openings through the photo resist 218 to expose the seed layer 216.

A conductive material 220 is formed in the openings of the photo resist 218 and on the exposed portions of the seed layer 216. The conductive material 220 may be formed by plating, such as electroplating or electroless plating, or the like. The conductive material 220 may comprise a conductive material, such as a metal, like copper, titanium, tungsten, aluminum, or the like.

Figure 10:
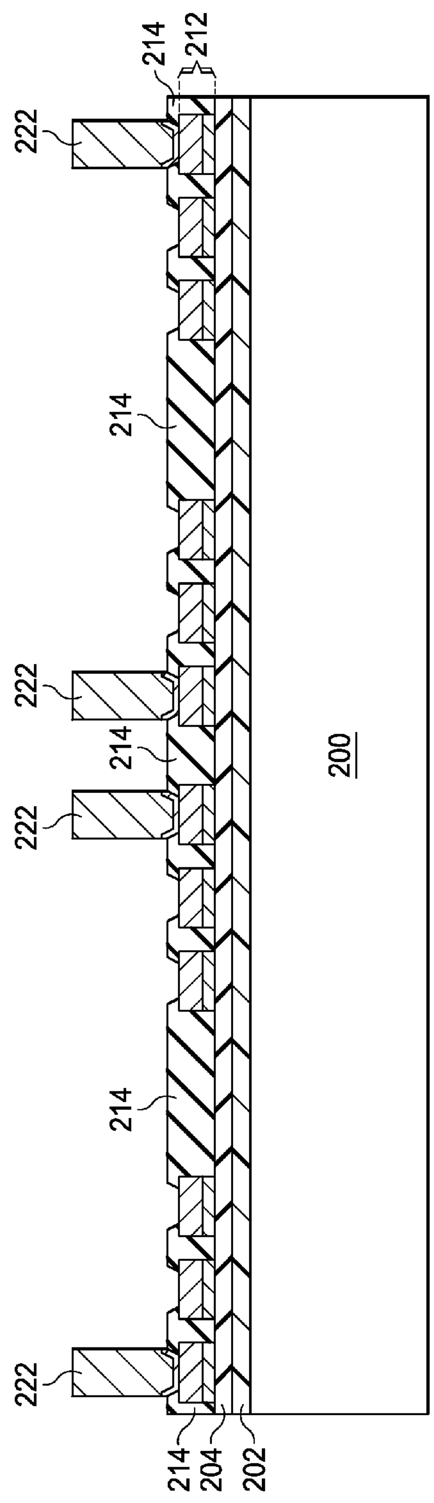

In FIG. 10, the photo resist 218 and portions of the seed layer 216 on which the conductive material 220 is not formed are removed. The photo resist 218 may be removed by an acceptable ashing or stripping process, such as using an oxygen plasma or the like. Once the photo resist 218 is removed, exposed portions of the seed layer 216 are removed, such as by using an acceptable etching process, such as by wet or dry etching. The remaining portions of the seed layer 216 and conductive material 220 form through vias 222.

Figure 11:
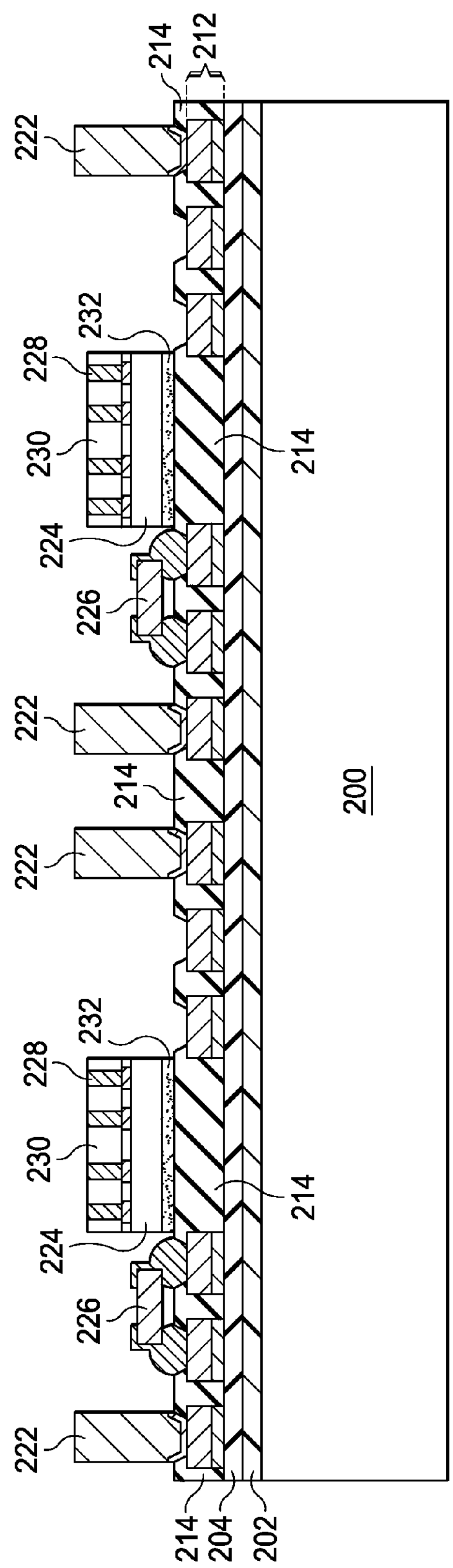

In FIG. 11, integrated circuit dies 224 are adhered to the dielectric layer 214, and SMDs 226 are bonded to exposed portions of the metallization pattern 212. Before being adhered to the dielectric layer 214, the integrated circuit dies 224 may be processed according to applicable manufacturing processes to form integrated circuits in the integrated circuit dies 224. For example, devices, such as transistors, diodes, capacitors, resistors, etc., may be formed in and/or on a semiconductor substrate, such as a semiconductor wafer, and may be interconnected by interconnect structures formed by, for example, metallization patterns in one or more dielectric layers on the semiconductor substrate to form an integrated circuit. Die connectors 228, such as conductive pillars (for example, comprising a metal such as copper), may be formed exterior to the integrated circuit dies 224 by, for example, plating to be mechanically and electrically coupled to the respective integrated circuit dies 224 on what may be referred to as respective active sides of the integrated circuit dies 224. A dielectric material 230 may be formed over the integrated circuit dies 224 and the die connectors 228, for example, by spin coating, lamination, CVD, or the like. An adhesive 232 may be applied to a back side of the integrated circuit dies 224, such as to a back side of the respective semiconductor wafer. The adhesive 232 may be any suitable adhesive, epoxy, or the like. The integrated circuit dies 224 may be singulated, such as by sawing or dicing, and adhered to the dielectric layer 214 by the adhesive 232 using, for example, a pick-and-place tool.

SMDs 226 are connected between exposed portions, e.g., pads, of the metallization pattern 212. The SMDs 226 may be connected to the exposed portions of the metallization pattern 212 using, for example, a pick-and-place tool, and bonding the SMDs 226 to the exposed portions by metal-to-metal bonding, solder reflowing, or the like. In some embodiments, the SMDs 226 are low resistance resistors, such as having a resistance less than about 0.1 ohms, and more specifically, less than about 0.05 ohms. In other embodiments, other components, such as a wire bond or other acceptable jumper, may be used as an anti-fuse between the exposed portions, e.g., pads, of the metallization pattern 212. When a wire bond is used, any acceptable wire bonding technique may be used to form the wire bond on the exposed portions of the metallization pattern. One of ordinary skill in the art will readily understand other appropriate techniques for forming other jumpers.

Figure 12:
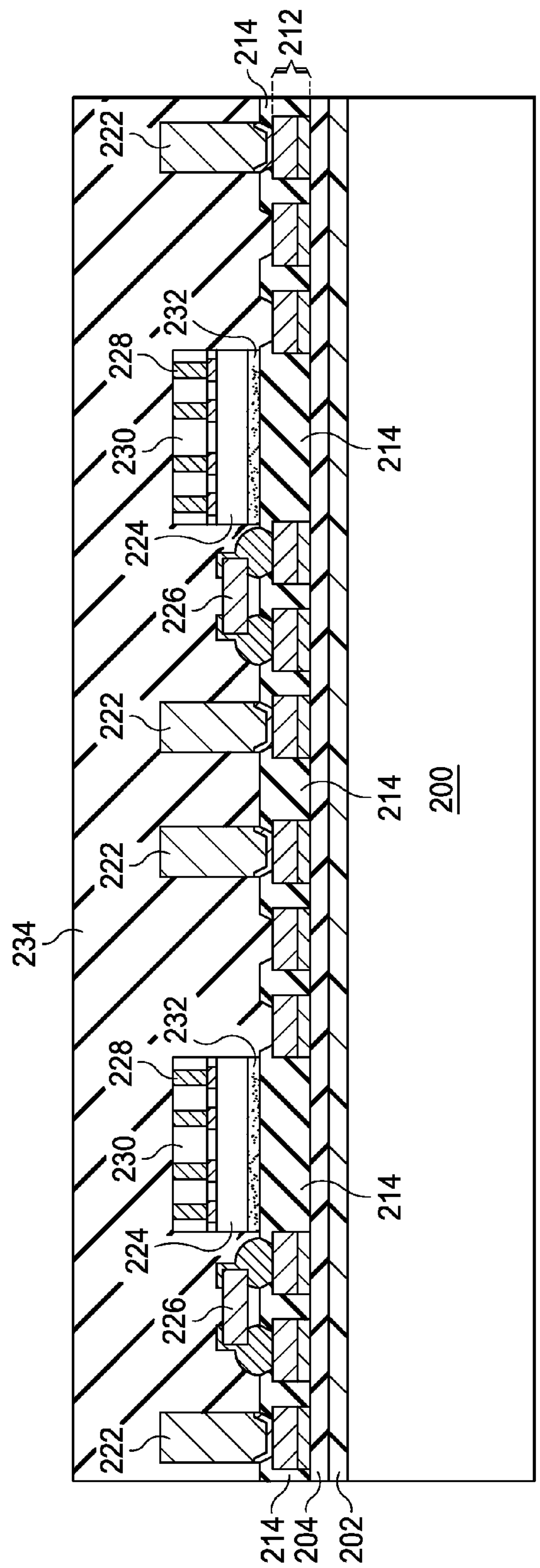
Figure 13:
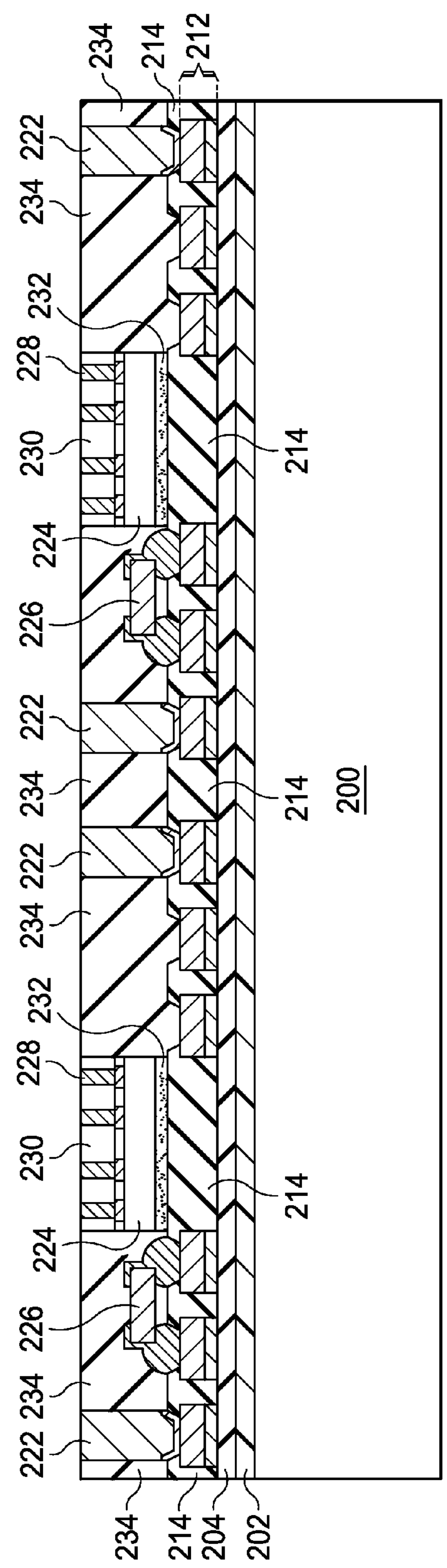

In FIG. 12, an encapsulant 234 is formed on the various components. The encapsulant 234 may be a molding compound, epoxy, or the like, and may be applied by compression molding, transfer molding, or the like. In FIG. 13, after curing, the encapsulant 234 undergoes a grinding process to expose the through vias 222 and die connectors 228. Top surfaces of the through vias 222, die connectors 228, and encapsulant 234 are co-planar after the grinding process. The SMDs 226 may remain embedded in the encapsulant 234.

Figure 14:
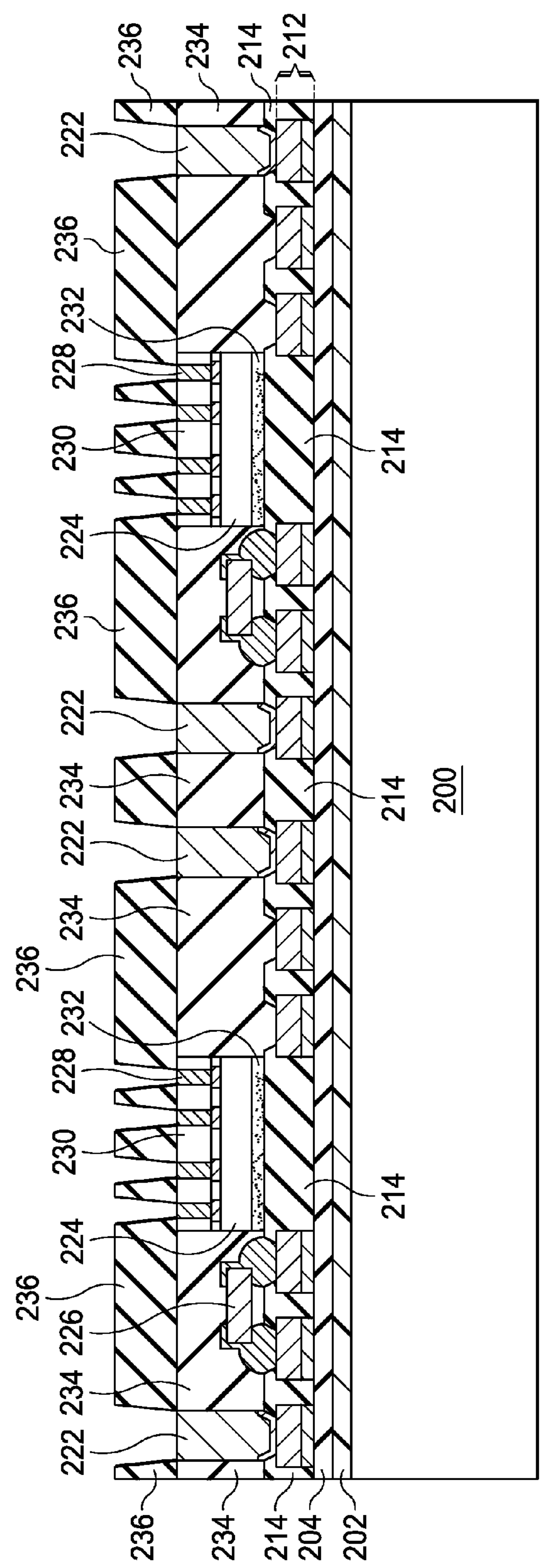

In FIG. 14, a dielectric layer 236 is formed on the encapsulant 234, through vias 222, and die connectors 228. In some embodiments, the dielectric layer 236 is formed of a polymer, which may be a photo-sensitive material such as PBO, polyimide, BCB, or the like, that may be easily patterned using a lithography mask. In other embodiments, the dielectric layer 236 is formed of a nitride such as silicon nitride; an oxide such as silicon oxide, PSG, BSG, BPSG; or the like. The dielectric layer 236 may be formed by spin coating, lamination, CVD, the like, or a combination thereof. The dielectric layer 236 is then patterned to form openings to expose the through vias 222 and the die connectors 228. The patterning may be by an acceptable process, such as by exposing the dielectric layer 236 to light when the dielectric layer is a photo-sensitive material or by etching using, for example, an anisotropic etch.

Figure 15:
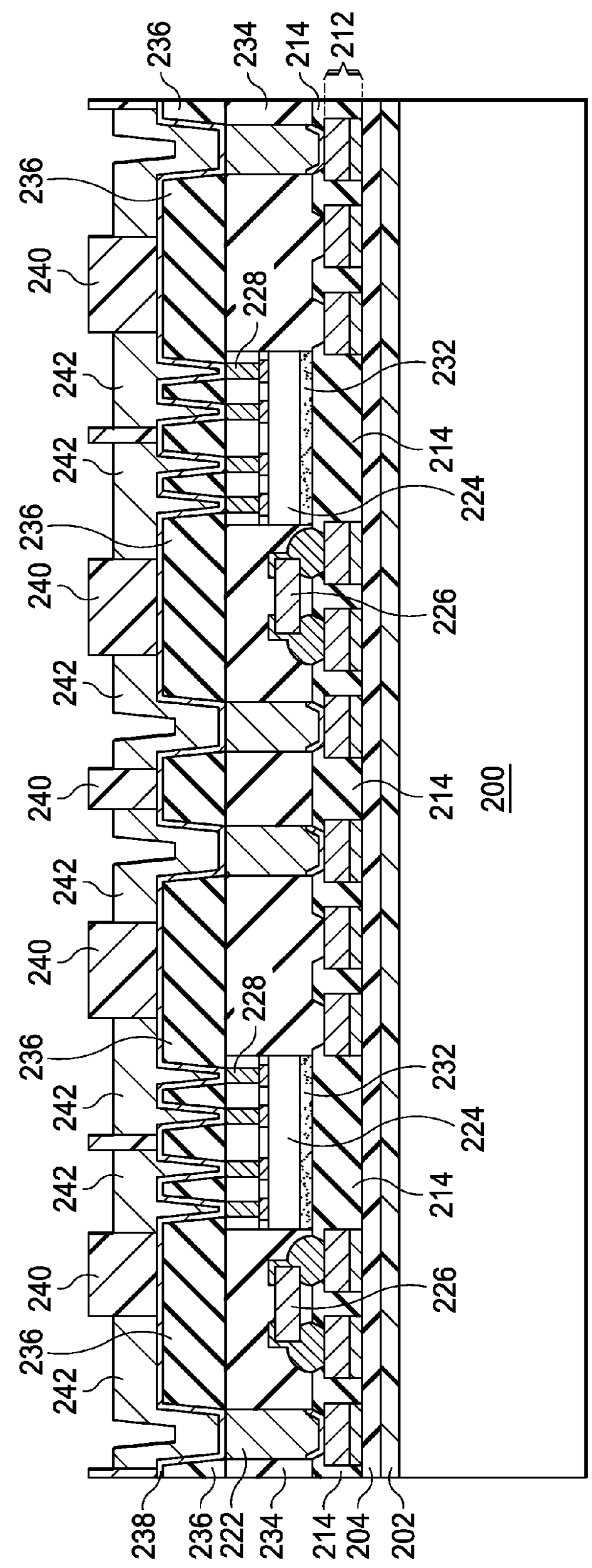

In FIG. 15, a seed layer 238 is formed over the dielectric layer 236 and in openings in the dielectric layer 236. In some embodiments, the seed layer 238 is a metal layer, which may be a single layer or a composite layer comprising a plurality of sub-layers formed of different materials. In some embodiments, the seed layer 238 comprises a titanium layer and a copper layer over the titanium layer. The seed layer 238 may be formed using, for example, PVD or the like.

A photo resist 240 is formed and patterned on the seed layer 238. The photo resist 240 may be formed by spin coating or the like and may be exposed to light for patterning. The pattern of the photo resist 240 corresponds to a metallization pattern. The patterning forms openings through the photo resist 240 to expose the seed layer 238.

A conductive material 242 is formed in the openings of the photo resist 240 and on the exposed portions of the seed layer 238. The conductive material 242 may be formed by plating, such as electroplating or electroless plating, or the like. The conductive material 242 may comprise a conductive material, such as a metal, like copper, titanium, tungsten, aluminum, or the like.

Figure 16:
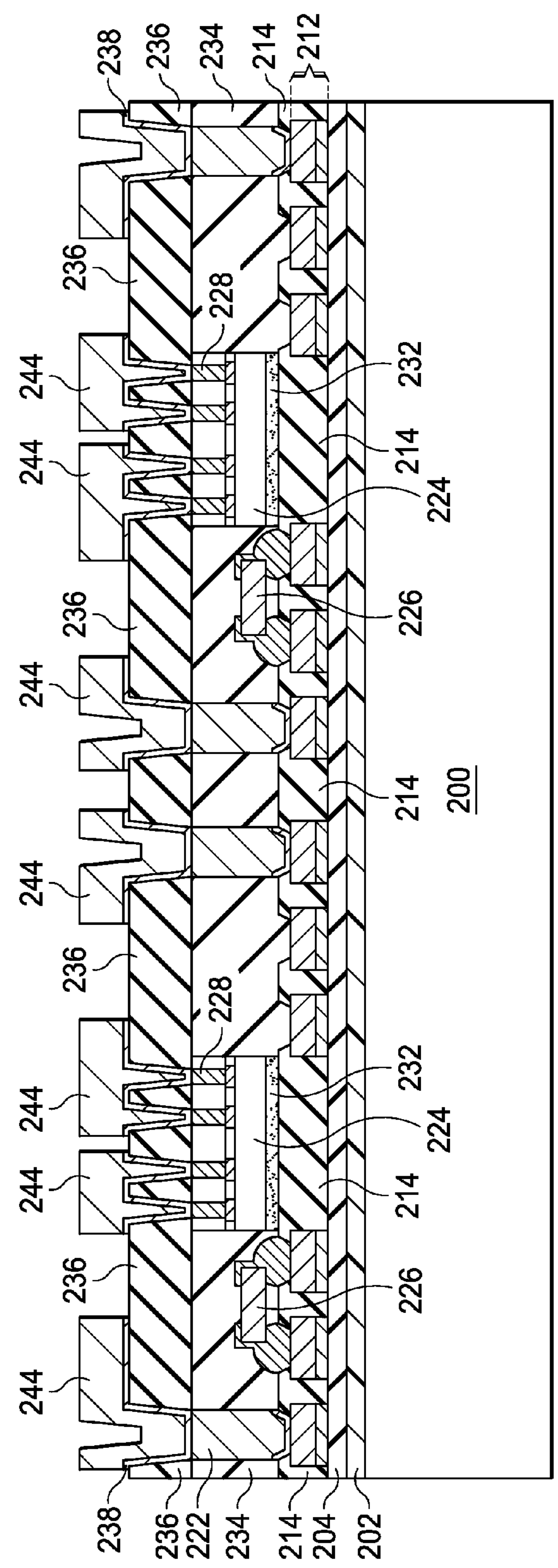

In FIG. 16, the photo resist 240 and portions of the seed layer 238 on which the conductive material 242 is not formed are removed. The photo resist 240 may be removed by an acceptable ashing or stripping process, such as using an oxygen plasma or the like. Once the photo resist 240 is removed, exposed portions of the seed layer 238 are removed, such as by using an acceptable etching process, such as by wet or dry etching. The remaining portions of the seed layer 238 and conductive material 242 form a metallization pattern 244.

Figure 17:
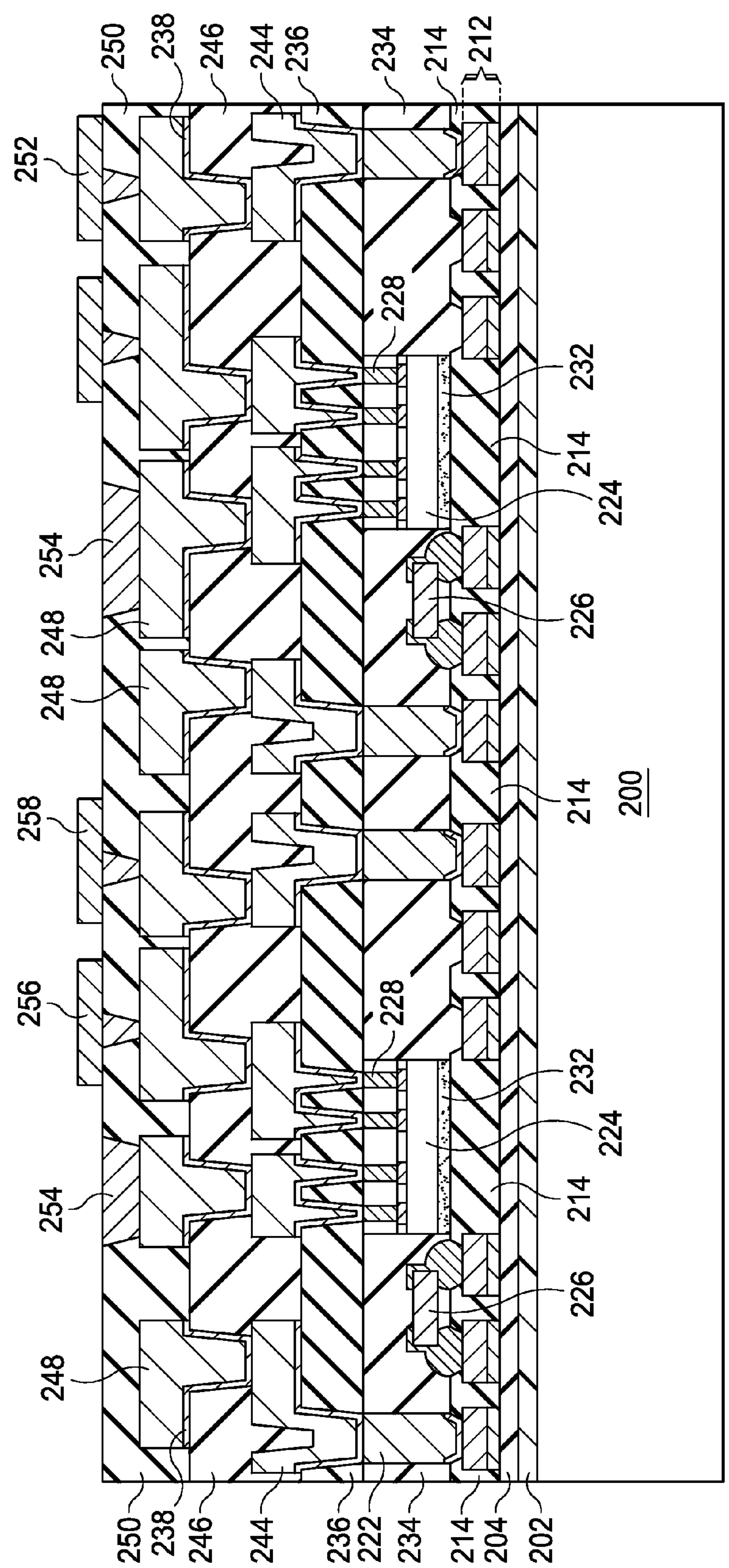

In FIG. 17, dielectric layers 246 and 250 and metallization patterns 248 and 252 are formed by repeating processes discussed above with respect to FIGS. 15 and 16. In some embodiments, these additional dielectric layers and metallization patterns are omitted, while in other embodiments, more or less dielectric layers and metallization patterns may be formed. As illustrated in FIG. 17, the metallization pattern 252 includes under-metal 254 and pads 256 and 258 exposed from and/or on the exterior surface of the dielectric layer 250.

Figure 18:
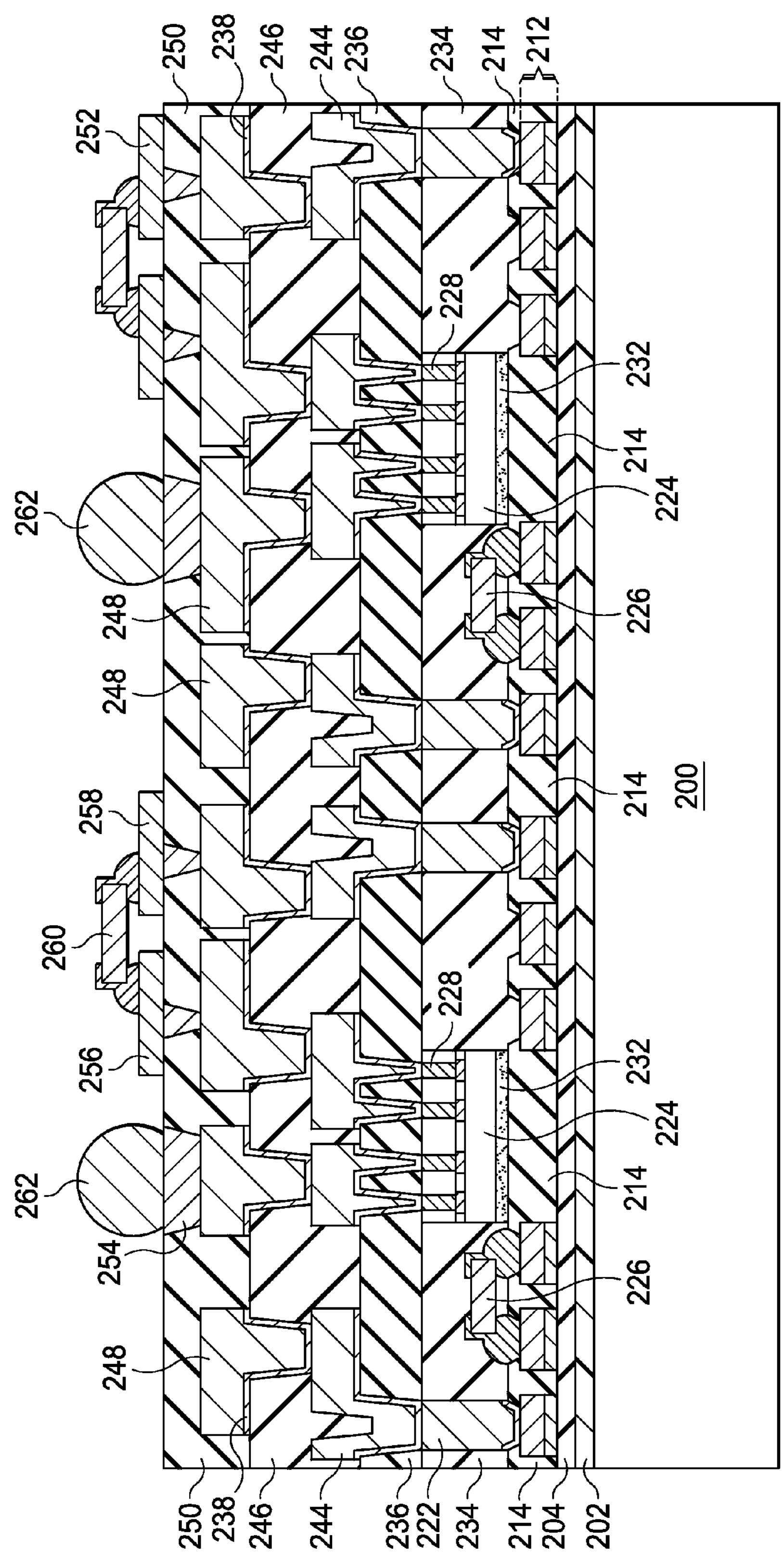

In FIG. 18, SMDs 260 are connected between pads 256 and 258 of the metallization pattern 252. The SMDs 260 may be connected to the pads 256 and 258 of the metallization pattern 252 using, for example, a pick-and-place tool, and bonding the SMDs 260 to the pads 256 and 258 by metal-to-metal bonding, solder reflowing, or the like. In some embodiments, the SMDs 260 are low resistance resistors, such as having a resistance less than about 0.1 ohms, and more specifically, less than about 0.05 ohms. In other embodiments, other components, such as a wire bond or other acceptable jumper, may be used as an anti-fuse between the pads 256 and 258 of the metallization pattern 252. When a wire bond is used, any acceptable wire bonding technique may be used to form the wire bond on the exposed portions of the metallization pattern. One of ordinary skill in the art will readily understand other appropriate techniques for forming other jumpers.

External connectors 262, such as solder balls like ball grid array (BGA) balls, are formed on the under-metal 254, such as by using an appropriate ball drop process. In some embodiments, the external connectors 262 comprise solder, such as a Sn—Ag alloy, a Sn—Ag—Cu alloy, or the like, and may be lead-free or lead-containing.

Figure 19:
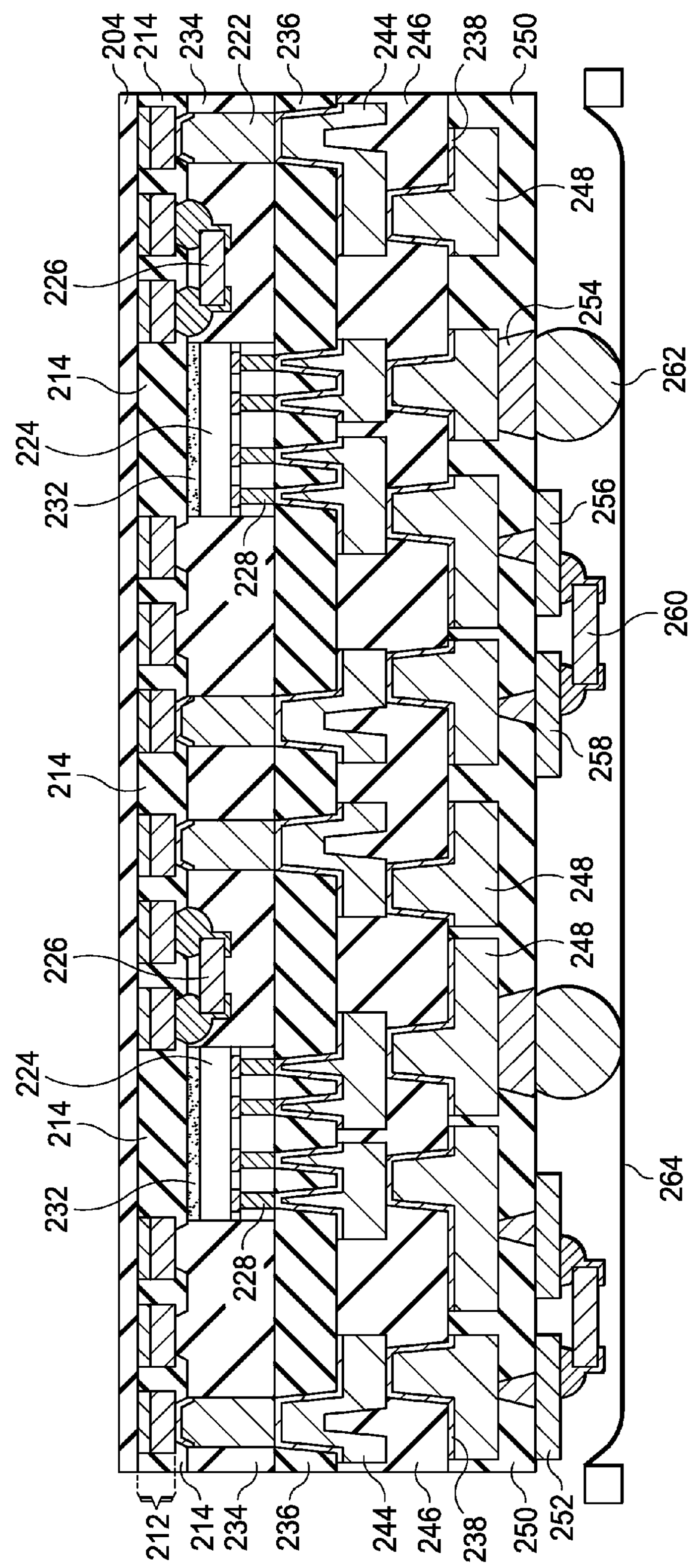

In FIG. 19, a carrier de-bonding is performed to detach (de-bond) carrier 200 from the overlying structure. In accordance with some embodiments, the de-bonding includes projecting a light such as a laser light or an UV light on release layer 202 so that release layer 202 decomposes under the heat of the light and carrier 200 can be removed. The structure is then flipped over and placed on a dicing tape 264.

Figure 20:
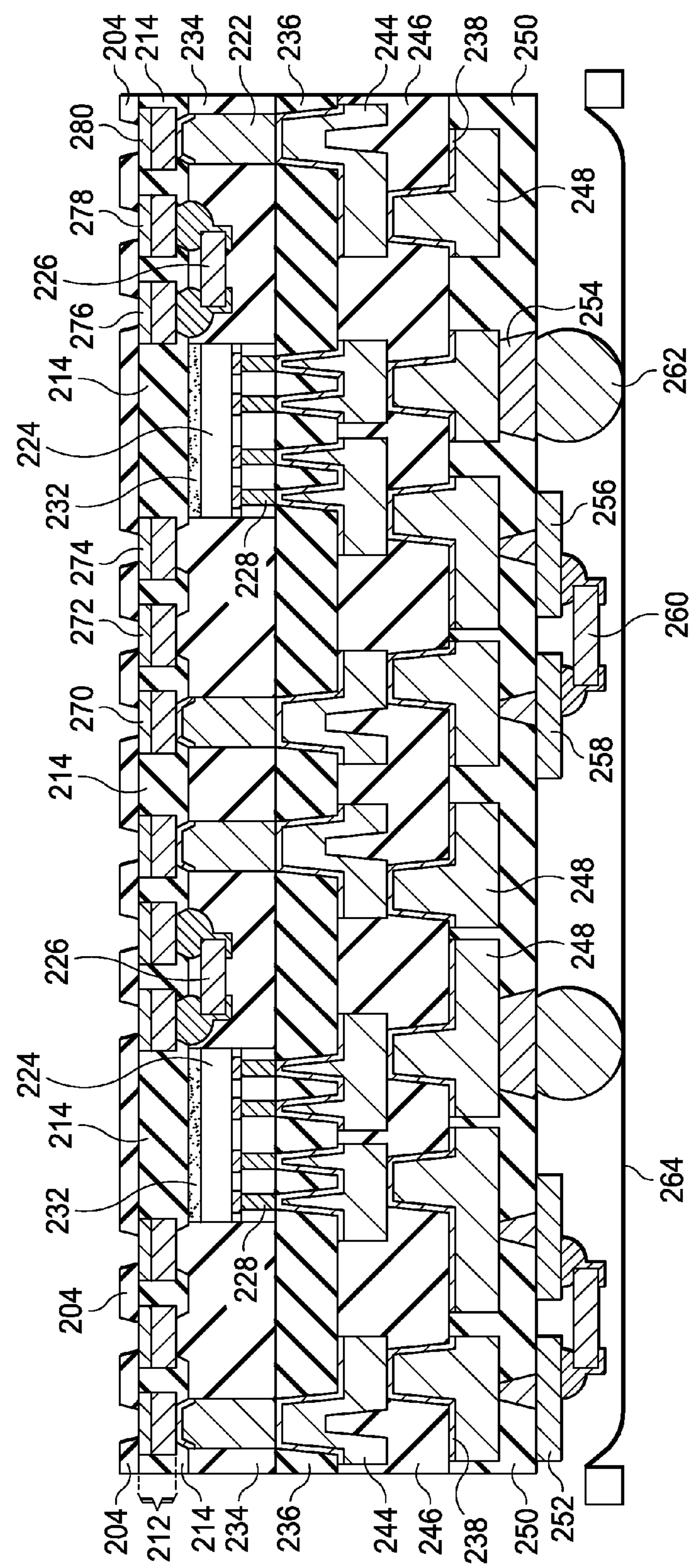

In FIG. 20, openings are formed through the dielectric layer 204 to expose portions of the metallization pattern 212. The exposed portions of the metallization pattern 212 form pads 270, 272, 274, 276, 278, and 280. The openings may be formed, for example, using laser drilling, etching, or the like.

Figure 21:
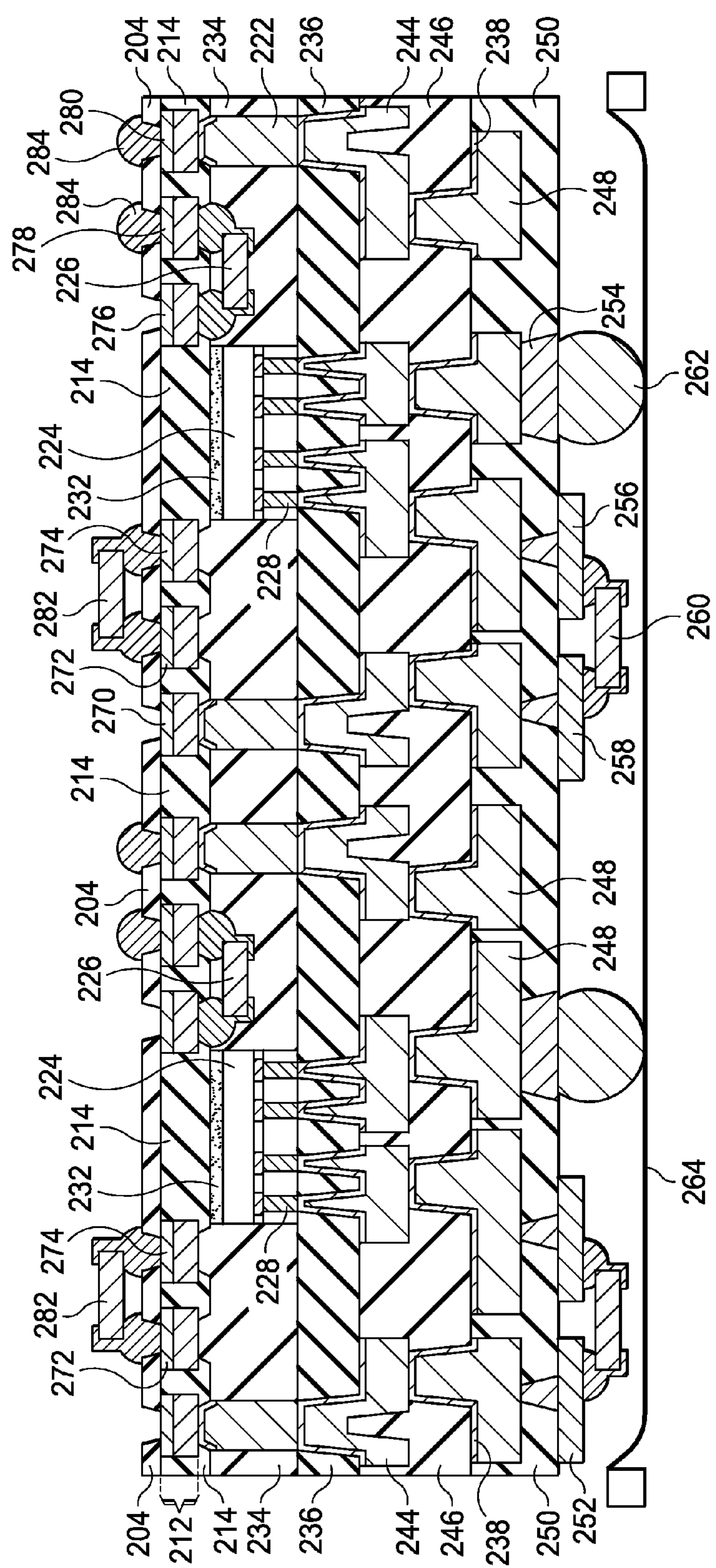

In FIG. 21, SMDs 282 are connected between pads 272 and 274 of the metallization pattern 212. The SMDs 282 may be connected to the pads 272 and 274 of the metallization pattern 212 using, for example, a pick-and-place tool, and bonding the SMDs 282 to the pads 272 and 274 by metal-to-metal bonding, solder reflowing, or the like. In some embodiments, the SMDs 282 are low resistance resistors, such as having a resistance less than about 0.1 ohms, and more specifically, less than about 0.05 ohms. In other embodiments, other components, such as a wire bond or other acceptable jumper, may be used as an anti-fuse between the pads 272 and 274 of the metallization pattern 212. When a wire bond is used, any acceptable wire bonding technique may be used to form the wire bond on the exposed portions of the metallization pattern. One of ordinary skill in the art will readily understand other appropriate techniques for forming other jumpers.

Figure 22:
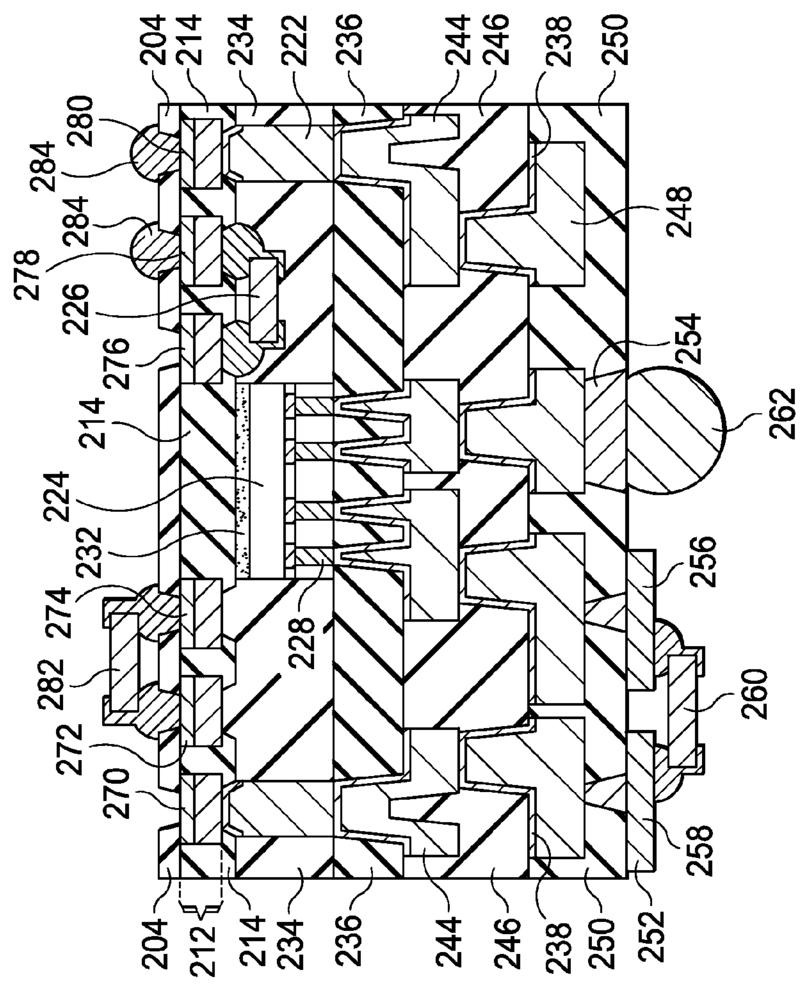

External connectors 284, such as solder bumps, metal pillars, the like, or a combination such as metal pillars with solder thereon, are formed on the pads 278 and 280 of the metallization pattern 212, such as by using an appropriate bumping process, plating process, the like, or a combination thereof. In some embodiments, the external connectors 284 comprise solder, such as a Sn—Ag alloy, a Sn—Ag—Cu alloy, or the like, and may be lead-free or lead-containing. FIG. 22 illustrates a package after sinuglation, such as by dicing or sawing.

The foregoing process illustrated in FIGS. 5 through 22 illustrates various placements of SMDs 226, 260, and 282. In other embodiments, SMDs 226, 260, and 282 may be placed in fewer or more locations within a package. The foregoing figures merely illustrate example locations where an SMD may be located. Further, other jumpers, such as wire bonds or the like, may be used in combination with or in the place of SMDs. A person of ordinary skill in the art will readily understand these modifications.

Embodiments may have advantages. Programming a circuit may be simplified and more reliable using an anti-fuse external to an integrated circuit die. In some previous applications, a fuse may have been in an integrated circuit die and may have been programmed using electrical burn out or laser cutting. In those applications, a thickness of a fuse portion of a fuse may be large causing electrical burn out or laser cutting to be difficult and causing the fuse to not be blown after such an electrical burn out or laser cutting. In some embodiments, an anti-fuse is placed in a package, external to an integrated circuit die, to program the circuit. This obviates any need to blow a fuse. Further, there may be increased flexibility in placement of an anti-fuse(s) in some embodiments.

An embodiment is a package structure. The package structure includes an integrated circuit die, a redistribution structure, an anti-fuse, and external connectors. The integrated circuit die is embedded in an encapsulant. The redistribution structure is on the encapsulant and is electrically coupled to the integrated circuit die. The anti-fuse is external to the integrated circuit die and the redistribution structure. The anti-fuse is mechanically and electrically coupled to the redistribution structure. The external connectors are on the redistribution structure, and the redistribution structure is disposed between the external connectors and the encapsulant.

Another embodiment is a package structure. The package structure includes a die, an encapsulant, a redistribution structure, and an anti-fuse. The die comprises an integrated circuit, and die connectors are on an active side of the die and are electrically coupled to the integrated circuit. The encapsulant at least laterally encapsulates the die. The redistribution structure is on and adjoins the encapsulant. At least a portion of the redistribution structure is directly coupled to the die connectors. The anti-fuse is mechanically and electrically coupled to pads on an exterior side of the redistribution structure.

Another embodiment is a method. The method includes encapsulating an integrated circuit die in an encapsulant; forming a redistribution structure adjoining the encapsulant, the redistribution structure comprising pads; and mechanically attaching an anti-fuse to the pads.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure comprising:

an integrated circuit die embedded in an encapsulant;

a first redistribution structure on a first side of the encapsulant and electrically coupled to the integrated circuit die;

a first anti-fuse external to the integrated circuit die and the first redistribution structure, the first anti-fuse being mechanically and electrically coupled to the first redistribution structure;

first external connectors on the first redistribution structure, the first redistribution structure being disposed between the first external connectors and the encapsulant, the first external connectors and the first anti-fuse being disposed on a same side of the first redistribution structure;

a second redistribution structure on a second side of the encapsulant and electrically coupled to the integrated circuit die, the second side of the encapsulant being opposite of the first side of the encapsulant;

a second anti-fuse external to the integrated circuit die and the second redistribution structure, the second anti-fuse being directly mechanically and electrically coupled to the second redistribution structure, the second anti-fuse being interposed between the first redistribution structure and the second redistribution structure; and second external connectors on the second redistribution structure, the second redistribution structure being disposed between the second external connectors and the encapsulant, the second external connectors and the second anti-fuse being disposed on opposite sides of the second redistribution structure.

2. The package structure of claim 1, wherein the first anti-fuse comprises a surface mount device.

3. The package structure of claim 2, wherein the surface mount device is a resistor.

4. The package structure of claim 1, wherein the first anti-fuse comprises a wire bond.

5. The package structure of claim 1, wherein the first side of the encapsulant corresponds to an active side of the integrated circuit die, the first anti-fuse being mechanically coupled to an exterior surface of the first redistribution structure.

6. The package structure of claim 1, wherein the second anti-fuse is embedded in the encapsulant.

7. The package structure of claim 1, further comprising a third anti-fuse external to the integrated circuit die and the second redistribution structure, the second anti-fuse being directly mechanically and electrically coupled to the second redistribution structure, the second external connectors and the third anti-fuse being disposed on a same side of the second redistribution structure.

8. A package structure comprising:

a die comprising an integrated circuit, die connectors being on an active side of the die and electrically coupled to the integrated circuit;

an encapsulant at least laterally encapsulating the die;

a first redistribution structure on and adjoining the encapsulant, at least a portion of the first redistribution structure being directly coupled to the die connectors;

a first anti-fuse external to the first redistribution structure, the first anti-fuse being directly mechanically and electrically coupled to pads on an exterior side of the first redistribution structure;

a second redistribution structure on and adjoining the encapsulant, the second redistribution structure being disposed on an opposite side of the encapsulant from the first redistribution structure, through vias in the encapsulant electrically coupling at least a portion of the first redistribution structure with at least a portion of the second redistribution structure;

a second anti-fuse external to the second redistribution structure, the second anti-fuse being directly mechanically and electrically coupled to pads on an exterior side of the second redistribution structure, the die being interposed between the first anti-fuse and the second anti-fuse; and a third anti-fuse directly mechanically and electrically coupled to the second redistribution structure, the third anti-fuse being directly mechanically and electrically coupled to pads of the second redistribution structure disposed on an interior side of the second redistribution structure, the third anti-fuse being embedded in the encapsulant.

9. The package structure of claim 8, wherein the first anti-fuse comprises a surface mount device.

10. The package structure of claim 9, wherein the surface mount device is a resistor.

11. The package structure of claim 8, wherein the first anti-fuse comprises a wire bond.

12. The package structure of claim 8, further comprising a first external connector on the exterior side of the first redistribution structure, the first external connector being laterally adjacent to the first anti-fuse.

13. The package structure of claim 12, further comprising a second external connector on the exterior side of the second redistribution structure, the second external connector being laterally adjacent to the second anti-fuse.

14. The package structure of claim 8, further comprising a plurality of external connectors on the exterior side of the second redistribution structure, the second anti-fuse being interposed between adjacent external connectors.

15. A method comprising:

forming a first redistribution structure, the first redistribution structure comprising first pads;

mechanically attaching an integrated circuit die to the first redistribution structure;

directly mechanically attaching a first anti-fuse to the first pads;

after directly mechanically attaching the first anti-fuse to the first pads, encapsulating the integrated circuit die in an encapsulant;

forming a second redistribution structure adjoining the encapsulant, the second redistribution structure comprising second pads, the second redistribution structure being directly mechanically attached to connectors of the integrated circuit die;

directly mechanically attaching a second anti-fuse to the second pads; and mounting external connectors on the second redistribution structure, the second redistribution structure being disposed between the external connectors and the encapsulant, the external connectors and the second anti-fuse being disposed on a same side of the second redistribution structure.

16. The method of claim 15, wherein the encapsulating further comprises encapsulating the first anti-fuse.

17. The method of claim 15, wherein the forming the second redistribution structure is wholly performed after the encapsulating, the second pads being on a side of the second redistribution structure opposite from the encapsulant.

18. The method of claim 15, wherein the forming the first redistribution structure is performed at least in part before the encapsulating, the first pads being on a side of the first redistribution structure nearest to the encapsulant.

19. The method of claim 15, wherein the first anti-fuse comprises a surface mount device, the surface mount device being a resistor.

20. The method of claim 15, wherein the first anti-fuse comprises a wire bond.

* * * * *